CIRCUIT PROVIDING PHASE SHIFT WHICH IS VARIABLE WITH FREQUENCY

Filed Dec. 7, 1966

INVENTOR
JAMES J. ROONEY JR.

BY John C Black
ATTORNEY

United States Patent Office 3,445,756
Patented May 20, 1969

3,445,756
CIRCUIT PROVIDING PHASE SHIFT WHICH IS VARIABLE WITH FREQUENCY

James J. Rooney, Jr., Vestal, N.Y., assignor to International Business Machines Corporation, Armonk, N.Y., a corporation of New York Filed Dec. 7, 1966, Ser. No. 599,918
Int. Cl. H03l 11/00
U.S. Cl. 323—119 7 Claims

ABSTRACT OF THE DISCLOSURE

An improved circuit provides in one transistor amplifier stage a phase shift which varies from one hundred-eighty degrees to zero degrees as the frequency of the input signal varies from a selected lower limit to a selected upper limit. A Class A common emitter transistor amplifier includes emitter and collector resistors and a negative feedback capacitor connected directly between the base-collector electrodes. The values of the resistors and the capacitor are selected to provide the transfer function which achieves the variable phase shift as a function of input frequency. The preferred embodiment uses resistors of equal value whereby the gain characteristic of the circuit is unity throughout the entire range of phase shift.

Figure 1:
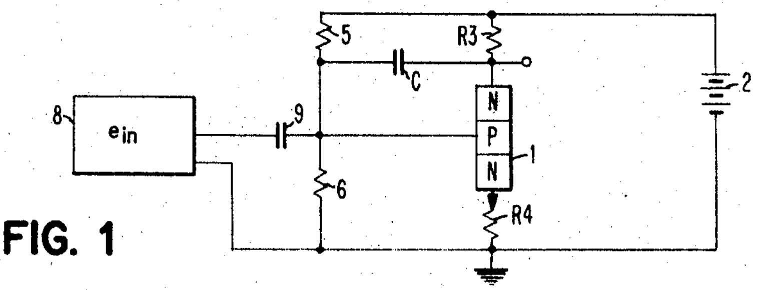

This invention is directed to an improved circuit of the type in which the amount of phase shift from input to output varies from one hundred-eighty degrees to zero degrees as the frequency of the input signal varies from a selected lower limit to a selected upper limit.

In the simplest form, a common emitter transistor amplifier with base-to-collector capacitive feedback provides at its collector electrode zero degrees to one hundred-eighty degrees phase shaft with variation in input frequency.

In circuits which are frequently referred to in the art as non-minimum phase shift networks, phase shifting is typically provided by resistor-capacitor networks. These circuits provide substantial changes in phase between the input and output signals as a function of changes in input frequency. The requirement for this type of circuit exists in data communication systems and the like. Known solutions to the problem are typically characterized by circuit complexity and a gain characteristic which varies with frequency and phase shift.

It is therefore the primary object of the present invention to provide a more simple and effective circuit which is capable of shifting the phase of the output signal with respect to that of the input signal from one hundred-eighty degrees to approximately zero degrees as a function of input signal frequency.

It is a more specific object of the present invention to provide an improved phase shifting circuit of the type described in the preceding object utilizing an active device such as a semiconductor transistor and taking the output signal from the collector electrode.

It is another object of the present invention to provide an improved phase shifting circuit of the type described in the preceding objects, wherein a constant gain characteristic is achieved throughout the full range of phase shift.

These objects are achieved in one preferred embodiment of the invention by providing a common emitter transistor amplifier operated Class A. The amplifier includes emitter and collector resistors and a negative feedback capacitor between the base-collector electrodes, the values of which resistors and capacitor are selected to provide a transfer function which achieves a variable phase shift of from one hundred-eighty degrees to zero degrees as the input frequency varies from a selected lower limit to a selected upper limit. The preferred embodiment utilizes emitter and collector resistor values which are equal whereby the value of the gain characteristic of the circuit is unity throughout the entire range of phase shift from one hundred-eighty degrees to zero degrees. The improved circuit requires a minimum number of components having carefully controlled tolerances, e.g. three. A feature of the improved phase shift circuit is that the load looks back only into one impedance, i.e. that of the collector circuit.

The foregoing and other objects, features and advantages of the invention will be apparent from the following more particular description of preferred embodiments of the invention, as illustrated in the accompanying drawings.

Figure 2A:
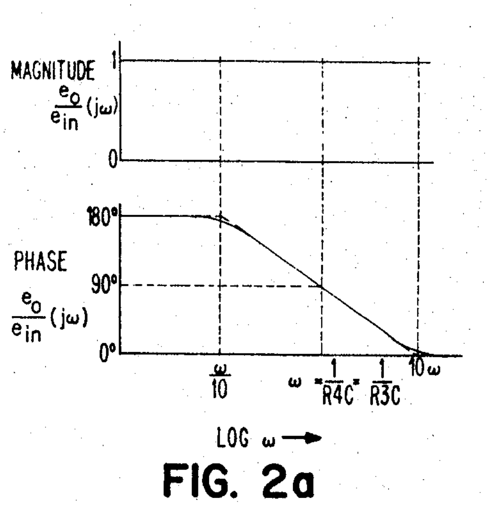
Figure 2B:
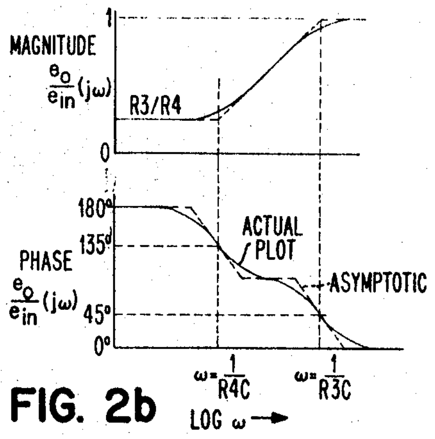
Figures 2C, 3:
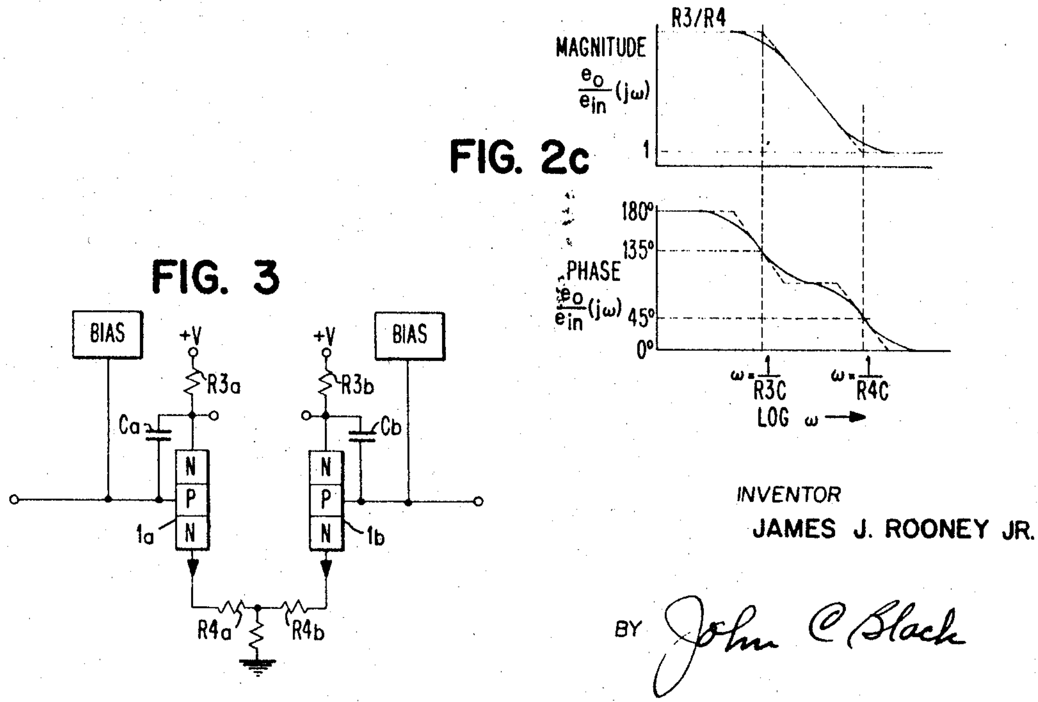

In the drawings:

FIG. 1 shows a transistor amplifier incorporating the improvements of the present invention;

FIGS. 2*a*, 2*b* and 2*c* illustrate phase and amplitude characteristics versus frequency of the amplifier of FIG. 1; and FIG. 3 is a differential amplifier incorporating the improvements of the present invention.

In FIG. 1 a common emitter transistor amplifier 1 is coupled to a source of operating potential 2 by means of emitter and collector resistors R3 and R4. A voltage divider comprising resistors 5 and 6 biases the amplifier 1 at a selected point in its linear region. A negative feedback capacitor C is coupled between the base and collector electrodes of the amplifier 1. A source of input voltage 8 is connected to the base electrode of the amplifier by means of a suitable coupling capacitor 9.

In FIG. 1, it is assumed that the value of the resistor R4 is substantially larger than the value of the internal emitter resistance of the transistor 1 and that the cut-off frequency of the transistor is substantially higher than the frequencies at which the circuit is operated. The impedance of the source 8 must be substantially less than the impedance of the capacitor C multiplied by the gain of the amplifier. Also, the impedance of the bias resistors 5 and 6 is substantially greater than the impedance of the source 8.

The circuit of FIG. 1 provides a transfer function according to the equation:

$$\frac{e_o}{e_{in}}(s)=\frac{G(1-S\tau_1)}{1+S\tau_2} \qquad (1)$$

wherein:

G=the D.C. (direct current) gain of the circuit;
S=the complex frequency encountered in LaPlace transform theory;
$\tau_1$=the time constant of the components R4 and C;
$\tau_2$=the time constant of R3 and C;
$e_o$=the output voltage; and
$e_{in}$=the input voltage.

The value of the voltage ratio $$\left[\frac{e_o}{e_{in}}(s)\right]$$

at any sinusoidal angular frequency $\omega$ is found by replacing $(s)$ by $j\omega$; the gain and phase characteristics are then given by the magnitude and angle of $$\frac{e_o}{e_{in}}(j\omega)$$

$$\frac{e_o}{e_{in}}(j\omega)=\frac{G(1-j\omega\tau_1)}{1+j\omega\tau_2} \qquad (2)$$

The D.C. gain G of the circuit is equal to $$\frac{-R3}{R4}$$

and Equation 2 may be rewritten as:

$$\frac{e_o}{e_{in}}(j\omega)=\frac{-R3}{R4}\left(\frac{1-j\omega\cdot R4\cdot C}{1+j\omega\cdot R3\cdot C}\right) \qquad (3)$$

The resistor identified as R3 is actually the total load resistance of the amplifier 1 and it will, therefore, be appreciated that in a practical embodiment wherein a load is driven, R3 is the equivalent of the parallel-coupled resistor which is normally connected between the collector and the supply potential and the impedance of the load device. Also, the resistor identified as R4 in fast includes within it the value of the transistor emitter impedance which exists at the operating level.

The property of interest herein can be shown by considering Equation 2 over a range of frequencies:
At D.C.

$$(j\omega=0),\ \frac{e_o}{e_{in}}(j\omega)=G$$

At high frequencies where $S\tau_1$ and $S\tau_2>>1$ $$\frac{e_o}{e_{in}}(j\omega)\simeq\frac{-G\tau_1}{\tau_2}$$

The gain has changed phase by one hundred-eighty degrees.

In the specific case where $\tau_1=\tau_2$ and $G=-1$, Equation 1 gives the following:
At D.C.

$$(j\omega=0),\ \frac{e_o}{e_{in}}(s)\simeq-1$$

At high frequencies where $S\tau_1$ and $S\tau_2>>1$ $$\frac{e_o}{e_{in}}(e)\simeq+1$$

This circuit exhibits constant gain and one hundred-eighty degrees phase shift as a function of frequency. This characteristic is illustrated in FIG. 2*a* where the magnitude and phase of Equation 3 is plotted for the case $G=-1$ or $R3=R4$. These plots are conventional Bode plots and the actual deviation from straight line asymptotes are given in any text on Bode plots; i.e. "Kuo-Automatic Control Systems"—Prentice Hall, 1962.

FIG. 2*b* illustrates the frequency versus amplitude and phase characteristics when $\tau_1>>\tau_2$; that is, when R4 is much greater than R3. FIG. 2*c* illustrates the frequency versus gain and phase characteristics when $\tau_2>>\tau_1$; that is, when R3 is much greater than R4. The phase shift approaches zero degrees as the frequency approaches infinity. However, the phase shift in FIG. 2*a* varies almost one hundred-eighty degrees in two frequency decades.

FIG. 3 illustrates a Class A differential amplifier incorporating the teachings of the present invention. Components in FIG. 3 which correspond to those in FIG. 1 are assigned similar reference numbers with suffixes *a* and *b* added.

Thus the amplifier includes transistors 1*a* and 1*b*, feedback capacitors C*a* and C*b* and resistors R3*a*, R4*a*, R3*b* and R4*b*. The amplifier is symmetrical, e.g. $R3a=R3b$, $R4a=R4b$ and $Ca=Cb$. If the output of the amplifier is differential, then Equation 1 still holds true; if the output is single ended, the gain is reduced by one-half.

While the invention has been particularly shown and described with reference to preferred embodiments thereof, it will be understood by those skilled in the art that the foregoing and other changes in form and details may be made therein without departing from the spiirt and scope of the invention.

What is claimed is:

1. Electrical apparatus comprising:
a low impedance source of electrical signals which vary in frequency within at least a portion of the frequency spectrum between first and second predetermined frequencies,
a common emitter transistor amplifier responsive to said signals, having an input base electrode, a common emitter electrode and an output collector electrode, and having an input impedance substantially greater than that of the source, and
means biasing the amplifier for Class A operation and having an impedance substantially greater than that of the source,
said amplifier including first and second resistors connected respectively in the collector and emitter circuits and a collector-to-base feedback capacitor connected between the base electrode and the junction between the first resistor and the collector electrode of selected values for producing, at the output collector electrode, signals shifted in phase as an inverse function of the frequency of the signals from the source.

2. The apparatus of claim 1 wherein the values and connections between the source, the bias means, the resistors and the capacitors provide the amplifier with a transfer function according to the equation:

$$\frac{e_o}{e_{in}}(s)=\frac{G(1-S\tau_1)}{(1+S\tau_2)}$$

where:

G=the D.C. (direct current) gain of the circuit;
S=the complex frequency encountered in LaPlace transform theory;
$\tau_1$=the time constant of the capacitor and the second resistor;
$\tau_2$=the time constant of the capacitor and the first resistor;
$e_o$=the output voltage; and
$e_{in}$=the input voltage.

3. The apparatus of claim 2 wherein said first and second resistors are of equal value to provide substantially constant gain as the frequency of the signals from the source varies within said frequency spectrum.

4. The apparatus of claim 3 wherein the frequency of the signals from the source varies over a range in the order of one hundred to one, said amplifier being effective to vary the phase of the output signals over a range of approximately one hundred-eighty degrees as an inverse function of the variation in source frequency over said range.

5. Electrical apparatus comprising:
a low impedance source of electrical signals which vary in frequency between the limits of at least a portion of the frequency spectrum between first and second predetermined frequencies,
a symmetrical differential amplifier responsive to said signals, and including a pair of transistors, each having an input base electrode, a common emitter electrode and an output collector electrode, said amplifier having an input impedance substantially greater than that of the source, and
means biasing the amplifier for Class A operation,
each transistor having respective first and second resistors connected respectively in its collector and emitter circuits and having a respective collector-to-base feedback capacitor connected between its base electrode and the junction between its first resistor and its collector electrode of selected values for producing, at its output collector electrode, signals shifted in phase as an inverse function of the frequency of the signals from the source.

6. The apparatus of claim 5 wherein said first and second resistors are of equal value to provide substantially constant gain as the frequency of the signals from the source varies within said frequency spectrum.

7. The apparatus of claim 6 wherein the frequency of the signals from the source varies over a range in the order of one hundred to one, said amplifier being effective to vary the phase of the output signals over a range of approximately one hundred-eighty degrees as a function of the variation in source frequency over said range.

References Cited

UNITED STATES PATENTS

| | | | |
|---|---|---|---|
| 3,112,451 | 11/1963 | Collins | 328—155 |
| 3,191,130 | 6/1965 | Rudd et al. | 328—155 X |
| 3,316,423 | 4/1967 | Hull. | |
| 3,319,079 | 5/1967 | Matsumoto | 328—155 X |

LEE T. HIX, *Primary Examiner.*

A. D. PELLINEN, *Assistant Examiner.*

U.S. Cl. X.R.

307—262; 328—155